United States Patent
Gottwald et al.

(10) Patent No.: US 9,848,499 B2
(45) Date of Patent: Dec. 19, 2017

(54) METHOD FOR PRODUCING A CIRCUIT BOARD AND CIRCUIT BOARD

(71) Applicants: Schweizer Electronic AG, Schramberg (DE); Continental Automotive GmbH, Hannover (DE)

(72) Inventors: Thomas Gottwald, Dunningen (DE); Bernd Reisslöhner, Kaisheim (DE); Thomas Rall, Dunningen Lackendorf (DE); Roland Brey, Eschlkam (DE); Gerald Hauer, Deuerling (DE); Tobias Steckermeier, Pettendorf (DE)

(73) Assignees: SCHWEIZER ELECTRONIC AG, Schramberg (DE); CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 15/311,234

(22) PCT Filed: May 21, 2015

(86) PCT No.: PCT/EP2015/001035
§ 371 (c)(1),
(2) Date: Nov. 15, 2016

(87) PCT Pub. No.: WO2015/176821
PCT Pub. Date: Nov. 26, 2015

(65) Prior Publication Data
US 2017/0086307 A1    Mar. 23, 2017

(30) Foreign Application Priority Data

May 23, 2014   (DE) .................. 10 2014 008 148

(51) Int. Cl.
*H05K 1/03*   (2006.01)
*H05K 1/09*   (2006.01)
(Continued)

(52) U.S. Cl.
CPC ............ *H05K 3/4644* (2013.01); *H05K 1/02* (2013.01); *H05K 1/0204* (2013.01);
(Continued)

(58) Field of Classification Search
CPC .. H05K 3/4644; H05K 1/0203; H05K 1/0204; H05K 2201/10416;
(Continued)

(56) References Cited

U.S. PATENT DOCUMENTS 9,668,336 B1 *   5/2017  Jacobsson ............ H05K 1/0212
2009/0052146 A1 *  2/2009  Busch .................. H05K 1/0204
                                                               361/748
(Continued)

FOREIGN PATENT DOCUMENTS

DE   10 2005 047 025    9/2005
DE   20 2011 110 068   12/2012
EP          0 766 506    2/1997

*Primary Examiner* — Sherman Ng
(74) *Attorney, Agent, or Firm* — Shlesinger, Arkwright & Garvey LLP

(57) ABSTRACT

A method of producing a printed circuit board (10) with a plurality of inlays (21, 22, 23, 24), having the following steps: supplying a plurality of inlays (21, 22, 23, 24), of which at least one inlay has at least one positioning element (21.1, 21.2; 22.1 to 22.7; 23.1, 23.2; 24.1, 24.2); building up a layer sequence from a plurality of printed-circuit-board layers, with at least one recess (14) for accommodating inlays, wherein, prior to the step of the plurality of inlays (21, 22, 23, 24) being inserted, the recess (14) is defined in an uppermost layer (12) by a frame made of non-conductive printed-circuit-board material; inserting the plurality of inlays (21, 22, 23, 24) into the recess (14) defined by the frame; covering the inlays (21, 22, 23, 24) with a non-conductive printed-circuit-board material; laminating the layer sequence, and removing at least the positioning ele- (Continued)

ments (21.1, 21.2; 22.1 to 22.7; 23.1, 23.2; 24.1, 24.2) which establish a conductive contact between neighboring inlays.

12 Claims, 3 Drawing Sheets

(51) Int. Cl.
*H05K 3/46* (2006.01)
*H05K 3/00* (2006.01)
*H05K 1/02* (2006.01)

(52) U.S. Cl.
CPC ......... *H05K 3/0044* (2013.01); *H05K 3/0058* (2013.01); *H05K 1/0203* (2013.01); *H05K 2201/09036* (2013.01); *H05K 2201/10416* (2013.01); *H05K 2203/061* (2013.01); *H05K 2203/167* (2013.01)

(58) Field of Classification Search
CPC .. H05K 2203/167; H05K 1/02; H05K 3/0044; H05K 3/0058; H05K 2201/09036; H05K 2203/061

See application file for complete search history.

(56) References Cited

U.S. PATENT DOCUMENTS

| | | | |
|---|---|---|---|
| 2011/0036627 A1* | 2/2011 | Loibl | H01R 43/0221 174/549 |
| 2011/0096495 A1* | 4/2011 | Heise | H05K 1/0263 361/688 |
| 2012/0024575 A1 | 2/2012 | Zhang et al. | |
| 2012/0103508 A1* | 5/2012 | Xie | G06K 19/072 156/264 |
| 2013/0329370 A1* | 12/2013 | Gottwald | H01L 23/5389 361/720 |
| 2015/0146379 A1* | 5/2015 | Katz | H05K 1/0204 361/707 |

* cited by examiner

METHOD FOR PRODUCING A CIRCUIT BOARD AND CIRCUIT BOARD

TECHNICAL FIELD

The present invention relates to the field of printed-circuit-board production and, in particular, to the production of inlays for insertion into printed circuit boards or into printed circuit boards which have the insertion of inlays included in their production process.

DESCRIPTION OF THE PRIOR ART

Inlays for printed circuit boards are known and widely used. An example to mention would be the multi-layered printed circuit board which is known from DE 10 2005 047 025 A1 and comprises an inlay which is made of a solid copper block and is inserted into a recess provided for it in the printed-circuit-board layer sequence.

Such inlays are usually produced individually, in particular by virtue of being punched out of a copper plate, or a plate made of some other suitable material, in order then to be inserted individually into recesses provided for them in a printed circuit board (or in a printed circuit board in an interim production step).

In contrast, the invention proposes a method of producing printed circuit boards which has the features as disclosed herein and a printed circuit board which has the features as disclosed herein.

In contrast to the procedure known from the prior art, that is to say where, for each individual inlay, a matching recess is milled out of the printed-circuit-board layer provided for this purpose, the concept of the invention, then, is to provide a relatively large recess into which a plurality of inlays can be inserted. For this purpose, the inlays, according to the invention, have positioning elements, so that they can be inserted into the correct position in the recess with the desired spacing apart from one another. Corresponding complementary aligning elements are provided on the frame made of printed-circuit-board material, said frame defining the recess in the printed-circuit-board layer. The term "positioning element" is to be understood, within the context of this application, to mean both protrusions or cutouts which act between an inlay and the surrounding printed-circuit-board material and spacing elements or spacers which act between adjacent inlays.

The procedure according to the invention allows inlays to be positioned in a printed-circuit-board layer with very small spacings apart from one another, since the positioning elements can be designed very precisely, even with small dimensions, in the punching operation. The small distances or gaps between the individual inlays mean that, during the following laminating operation with a prepreg layer positioned above, comparatively little liquefied resin material is required between the inlays, and this renders a layer construction with only a small number of thin prepregs possible, which results in a design with a relatively low level of thermal resistance between the inlays and a cooling body connected to one of the surfaces. According to the invention, it is thus possible to realize gaps between the inlays in the order of magnitude of around 100 μm (in relation to prior-art gap widths ranging from 1 to 2 mm).

Following lamination, the positioning elements and complementary aligning elements between the inlays are cut off. This is done for reasons of electrical isolation and therefore relates, in particular, to the spacing elements or spacers which act between inlays; it is not absolutely necessary to cut off non-conductive contacts of the positioning elements and complementary aligning elements (that is to say between the non-conductive printed-circuit-board material and an inlay). Cutting off can be done, for example, by drilling (right through, or deep into, the component) and/or milling (right, through, or deep into, the component) or the like.

The resulting holes can be filled, for example, with a non-conductive material.

According to the invention, it is possible to provide, on average, at least one positioning element per inlay which is to be placed in position. In a further embodiment, at least two positioning elements may be provided per adjacent/neighboring inlay. Since static fixing takes place typically via three points, it is possible to provide three positioning elements per pair of inlays.

The frame of the recess in the printed-circuit-board layer can have a total of at least two complementary aligning elements per inlay adjacent to the frame minus two (i.e. A≥2I−2, where A is the number of complementary aligning elements and I is the number of inlays adjacent to the frame). At least one positioning element designed in the form of a spacing element may be provided between two adjacent inlays. In practice, the number of spacing elements provided between two adjacent inlays should be at least enough to fix the inlays statically for further processing.

Further advantages and configurations of the invention can be gathered from the description and the accompanying drawing.

Of course, the features which have been mentioned above and those which are yet to be explained hereinbelow can be used not just in the combination specified in each case, but also in other combinations, or on their own, without constituting a departure from the framework of the present invention.

The invention is illustrated schematically in the drawing by way of an exemplary embodiment and will be described in detail hereinbelow with reference to the drawing.

DETAILED DESCRIPTION

In the figures, like reference signs denote like or similar elements.

Figure 1:
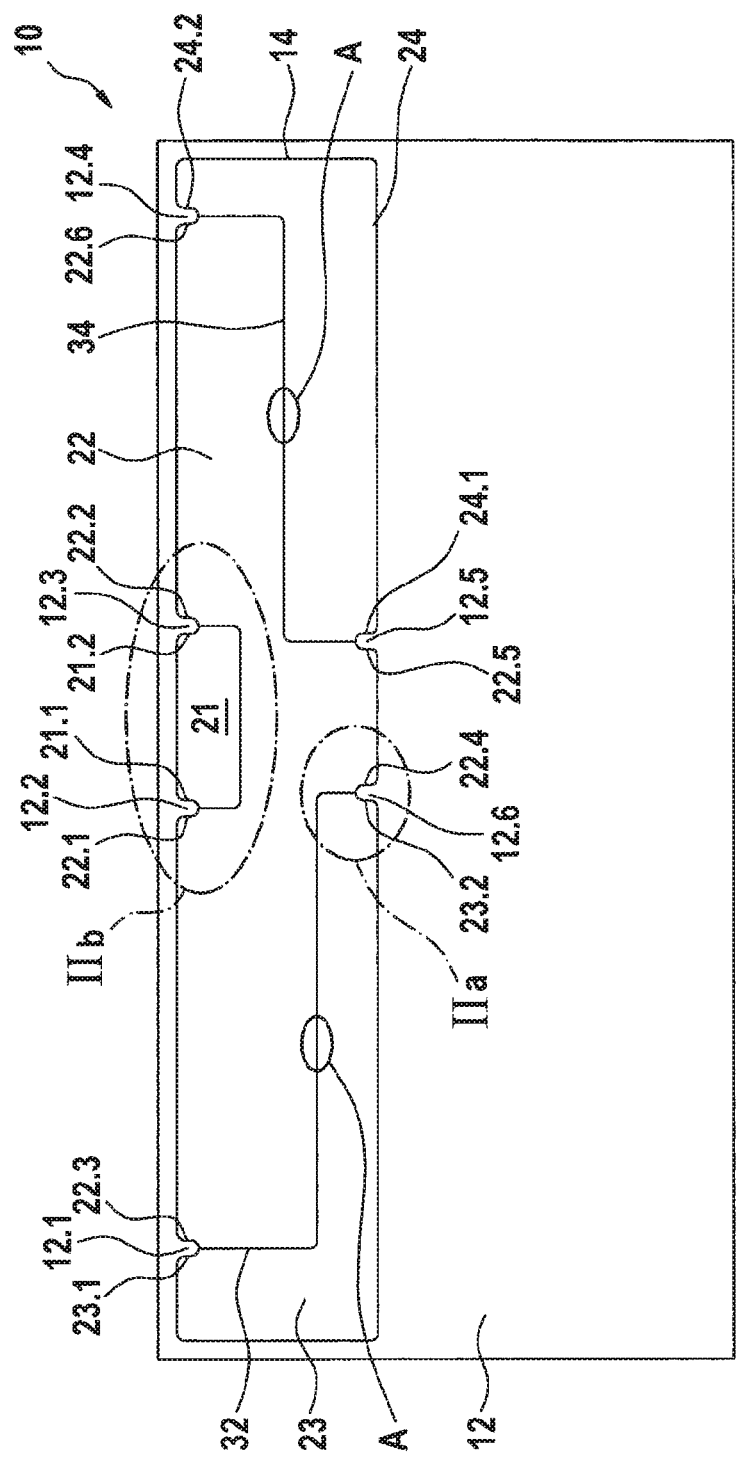
FIG. 1 shows a plan view of a printed-circuit-board layer, during production, with a plurality of inlays inserted according to the invention.

FIG. 1 shows a plan view of a layer sequence for producing a printed circuit board 10 during the production process.

The uppermost layer, which is directed toward the person viewing FIG. 1, is a printed-circuit-board layer 12 made of a non-conductive printed-circuit-board material, for example FR4 or the like.

The term "positioning element" is used, within the context of the present patent application and of the description which follows, to denote any kind of element which is formed on an inlay, in particular an inlay edge, and is suitable for positioning the inlay when it is inserted into a recess provided for it in a printed-circuit-board layer. Such positioning elements may be in particular, but not exclusively, lugs and/or convexities and/or protrusions and/or cutouts and/or indents and/or set-back portions or the like. The positioning elements may be provided on one or more inlay edges or side edges, wherein the term inlay edge also covers the corner of an inlay.

The printed-circuit-board layer 12 has a recess 14, into which a plurality of inlays 21, 22, 23, 24 (four of these inlays in the exemplary embodiment illustrated) are inserted. The printed-circuit-board material around the recess 14 serves as a frame for the inlays 21, 22, 23, 24, which are inserted therein in the manner of a puzzle.

Each of the inlays 21 to 24 comprises at least two positioning elements. In particular, each of the inlays 21 to 24 comprises two positioning elements per neighboring or adjacent inlay. In the exemplary embodiment illustrated, said positioning elements are cutouts which engage with lugs formed in a complementary manner as aligning elements on the frame. It is, of course, possible for the positioning elements to be configured in other ways.

Therefore, the first inlay 21, which is adjacent merely to the second inlay 22, comprises a first positioning element 21.1 and a second positioning element 21.2. In the same way, the third inlay 23 and the fourth inlay 24, which are likewise each adjacent only to the second inlay 22, each comprise a first positioning element 23.1, 24.1 and a second positioning element 23.2, 24.2. The second inlay 22 is adjacent to the three other inlays 21, 23, 24 and, accordingly, comprises a total of six positioning elements 22.1 to 22.6.

Figure 2A:
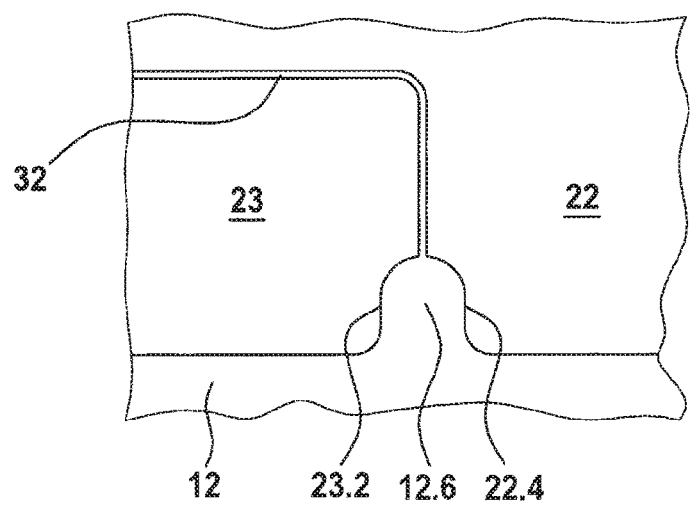
FIG. 2a shows, on an enlarged scale, a first detail from the illustration of FIG. 1.
Figure 2B:
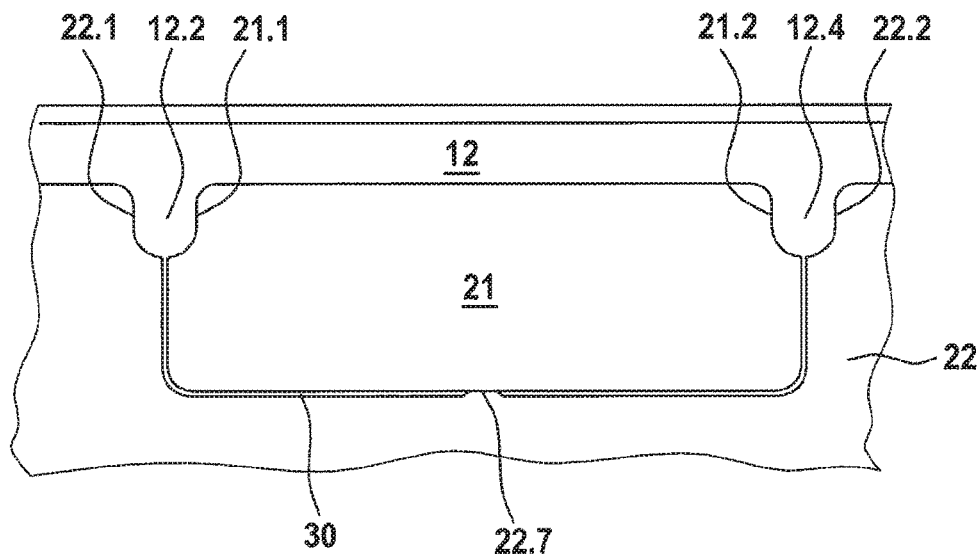
FIG. 2b shows, on an enlarged scale, a second detail from the illustration of FIG. 1.

As can be seen in particular also from the enlarged illustrations of FIGS. 2a and 2b, the positioning elements of the exemplary embodiment illustrated are cutouts which are each formed at a corner of the corresponding inlay and are designed to complement correspondingly designed aligning elements 12.1 to 12.6 on the frame of the printed-circuit-board layer 12. In the exemplary embodiment illustrated, the aligning elements 12.1 to 12.6 are designed in the form of lug-like protrusions in the FR-4 matrix.

The positioning elements of the inlays are dimensioned such that, when they are positioned against the associated complementary aligning element, they produce a narrow gap 30, 32, 34 between the corresponding inlays.

However, two positioning elements are not sufficient, at least not for every geometry, for producing a gap which remains stable even during the following laminating operation; it would thus be possible, for example in the exemplary embodiment illustrated, for the first inlay 21, which is placed in a recess of the second inlay 22, to be displaced in the Y direction, as seen in the illustration of the figure, and thus to come into contact, in an undesired manner, with the second inlay 22.

For this reason, the second inlay 22 has provided on it a narrow protrusion, which serves as a spacing element 22.7. The resulting three abutment or aligning points for the first inlay 21, that is to say the first positioning element 21.1 on the second aligning element 12.2 and the second positioning element 21.2 on the fourth aligning element 12.4 and also a further edge (the edge parallel to the straight line connecting the two positioning elements 21.1, 21.2) of the first inlay 21 on the spacing element 22.7 of the second inlay 22, mean that the first inlay 21 is restricted in all degrees of freedom in the X-Y plane and is thus fixed for the laminating process.

It is not absolutely imperative for the geometries of the third and of the fourth inlays 23, 24 to have a spacing element present in the gaps 32, 34 between the third and fourth inlays 23, 24, on the one hand, and the second inlay 22, on the other hand. In order, nevertheless, for it also to be ensured here that there is no undesired change in the gap dimension between the adjacent inlays during the laminating process as a result of any possible displacement or warping, it is likewise possible for corresponding spacing elements to be provided on in each case one of the two inlays directed toward one another, for example at the locations marked "A" in FIG. 1. It is, of course, possible, as a safeguard, for a plurality of spacing elements to be provided at defined locations of elongate inlay geometries. However, there should not be too many spacing elements provided; otherwise the following step of removing the spacing elements following lamination, for example by drilling and/or by milling deep into the component, may require too much outlay.

Figure 3:
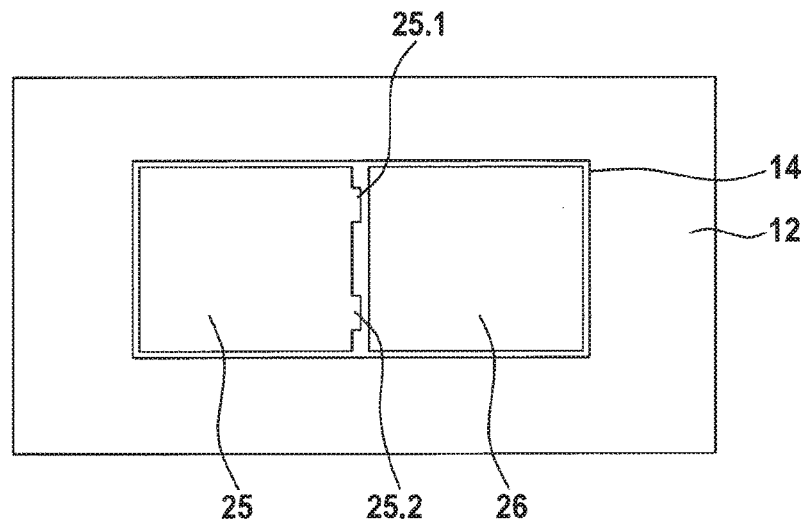
FIG. 3 shows a plan view of another example of a printed-circuit-board layer, during production, with two inlays inserted according to the invention.

In order to demonstrate the concept of the invention further, FIG. 3 illustrates a simple variant of a printed-circuit-board layer 12 with two inlays 25, 26 inserted. A first inlay 25 has two positioning elements 25.1, 25.2, which are designed in the form of essentially rectangular protrusions and are directed toward the neighboring, second inlay 26, which has no positioning element. The very simple geometry (both inlays are (with the exception of the two protrusions 25.1, 25.2) essentially rectangular, and it is also the case that the recess 14 in the printed-circuit-board layer 12 is essentially rectangular) means that there is no need for any further positioning elements and/or aligning elements in order to fix the inlays to a sufficient extent within the tolerance limits in the recess for follow-up processing. Following further fixing of the inlays, the positioning elements 25.1, 25.2 illustrated have to be removed, so as to avoid a short circuit, between the inlays.

Figure 4:
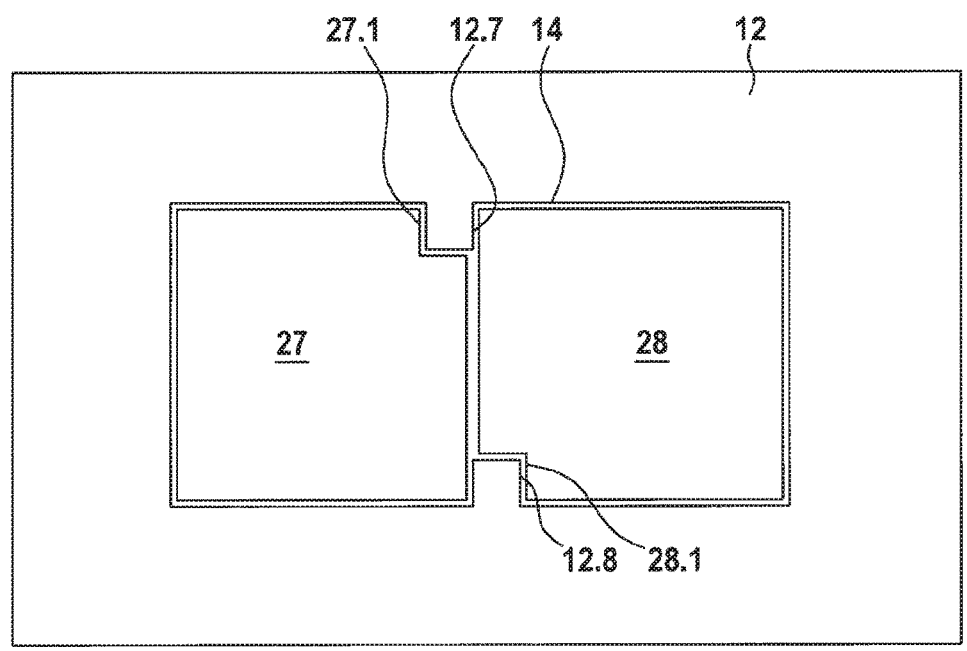
FIG. 4 shows a plan view of a further example of a printed-circuit-board layer, during production, with two inlays inserted according to the invention.

FIG. 4 illustrates a further simple variant of a printed-circuit-board layer 12 with two inlays 27, 28 inserted. The recess 14 in the printed-circuit-board layer 12 has two essentially rectangular protrusions 12.7 and 12.8, which serve as aligning elements. The two inlays 27, 28 each have a positioning element 27.1, 28.1, respectively. In the exemplary embodiment illustrated in FIG. 4, the two positioning elements 27.1, 28.1 are designed in the form of cutouts each located at a corner of the relevant inlay 27, 28, respectively. The arrangement of the cutouts 27.1 and 28.1, on the one hand, and of the protrusions 12.7 and 22.8, on the other hand, is selected such that, with the inlays 27, 28 closed in position, a respective cutout 27.1, 28.1 ends up in abutment in a complementary manner against an associated protrusion 12.7, 12.8, respectively, and a further planar edge of each inlay 27, 28 butts against a protrusion 22.8, 12.7, respectively. In other words: each of the aligning elements 12.7 and 12.8 has the function, on the one hand, of engaging in a complementary manner with the associated cutout 27.1, 28.1, respectively, and, on the other hand, of serving as an abutment surface for a side edge of the respectively other inlay 28, 27, and therefore each inlay, as seen in the x direction (the horizontal direction in the illustration of FIG. 4), has two locations positioned on the protrusions and a further location positioned at the corresponding left-hand or right-hand cutout periphery. For this purpose, each of the two protrusions 12.7, 12.8 is configured to be somewhat wider than the associated cutout 27.1, 28.1, respectively, in order to ensure a necessary or desired spacing between the two inlays and to compensate for any tolerances. The aligning elements 12.7, 12.8 thus also perform the function of the spacer. Since there are no positioning elements or spacers provided which (could) establish a contact between the two inlays, there is no need, in this exemplary embodiment, for the positioning elements to be removed.

The invention therefore provides a method of producing printed circuit boards by virtue of a plurality of inlays being positioned in a recess designed for accommodating a plurality of inlays in a printed-circuit-board layer. Positioning and spacing take place, according to the invention, such that the spacers are produced either by FR-4 structures (lugs, protrusions) or by inlay lugs, or by a combination of these two features, depending on what is advantageous for the application in respect of the specific inlay geometry.

The invention claimed is:

1. A method of producing a printed circuit board with a plurality of inlays, having the following steps:
   supplying a plurality of inlays, of which at least one inlay has at least one positioning element;
   building up a layer sequence from a plurality of printed-circuit-board layers, with at least one recess for accommodating inlays, wherein, prior to the step of the plurality of inlays being inserted, the recess is defined in an uppermost layer by a frame made of non-conductive printed-circuit-board material;
   inserting the plurality of inlays into the recess defined by the frame;
   covering the inlays with a non-conductive printed-circuit-board material;
   laminating the layer sequence; and
   removing at least the positioning elements which establish a conductive contact between neighboring inlays.

2. The method as claimed in claim 1, in which the positioning elements are cutouts or protrusions on the inlay side edges.

3. The method as claimed in claim 1, in which complementary aligning elements are formed on the frame, the positioning elements of the inlays being aligned thereon.

4. The method as claimed in claim 1, in which the positioning elements are removed by drilling or milling.

5. The method as claimed in claim 1, in which it is only the positioning elements which act between two adjacent inlays which are removed.

6. The method as claimed in claim 1, in which holes produced by removal of the positioning elements are filled with a non-conductive material.

7. A printed circuit board with a plurality of inlays, wherein the printed circuit board is formed by virtue of at least one inlay with at least one positioning element being inserted into a recess in a printed-circuit-board material layer and then positioning elements being at least partially removed in order to avoid conductive contact between neighboring inlays.

8. The printed circuit board as claimed in claim 7 with a plurality of inlays, which are inserted with the inlay-positioning elements being aligned on complementary aligning elements formed in the recess.

9. The printed circuit board as claimed in claim 7, in which on average at least one positioning element is provided per inlay.

10. The printed circuit board as claimed in claim 7, in which each inlay has at least two positioning elements per adjacent inlay, and at least $A=2I-2$ complementary aligning elements are provided in the recess per inlay (where A is the number of complementary aligning elements and I is the number of inlays).

11. The printed circuit board as claimed in claim 7, in which, at least for one adjacent pair of inlays, at least one positioning element is provided as a spacer, per adjacent pair of inlays, on at least one of the two inlays.

12. The printed circuit board as claimed in claim 7, in which holes produced by removal of positioning elements are filled with a non-conductive material.

* * * * *